(12) United States Patent
Venugopal et al.

(10) Patent No.: US 9,698,075 B2
(45) Date of Patent: Jul. 4, 2017

(54) INTEGRATION OF BACKSIDE HEAT SPREADER FOR THERMAL MANAGEMENT

(71) Applicant: Texas Instruments Incorporated, Dallas, TX (US)

(72) Inventors: Archana Venugopal, Dallas, TX (US); Marie Denison, Plano, TX (US); Luigi Colombo, Dallas, TX (US); Hiep Nguyen, Grand Prairie, TX (US); Darvin Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/210,970

(22) Filed: Jul. 15, 2016

(65) Prior Publication Data

US 2016/0322277 A1    Nov. 3, 2016

Related U.S. Application Data

(63) Continuation of application No. 14/499,222, filed on Sep. 28, 2014, now Pat. No. 9,496,198.

(51) Int. Cl.
*H01L 23/373*    (2006.01)
*H01L 23/00*     (2006.01)
(Continued)

(52) U.S. Cl.
CPC ........ *H01L 23/373* (2013.01); *H01L 21/4871* (2013.01); *H01L 21/4889* (2013.01); *H01L 23/367* (2013.01); *H01L 23/3675* (2013.01); *H01L 24/03* (2013.01); *H01L 24/05* (2013.01); *H01L 24/13* (2013.01); *H01L 24/32* (2013.01); *H01L 24/94* (2013.01); *H01L 24/16* (2013.01); *H01L 24/29* (2013.01); *H01L 24/48* (2013.01); *H01L 24/73* (2013.01); *H01L 2224/0345* (2013.01); *H01L 2224/0361* (2013.01); *H01L 2224/03416* (2013.01); *H01L 2224/03452* (2013.01); *H01L 2224/0401* (2013.01); *H01L 2224/04026* (2013.01); *H01L 2224/05073* (2013.01); *H01L 2224/05078* (2013.01); *H01L 2224/05082* (2013.01); *H01L 2224/05166* (2013.01); *H01L 2224/05187* (2013.01); *H01L 2224/05193* (2013.01); *H01L 2224/05558* (2013.01); *H01L 2224/05578* (2013.01); *H01L 2224/05647* (2013.01); *H01L 2224/05655* (2013.01); *H01L 2224/05666* (2013.01); *H01L 2224/05687* (2013.01); *H01L 2224/05693* (2013.01); *H01L 2224/08165* (2013.01);
(Continued)

(58) Field of Classification Search
None
See application file for complete search history.

(56) References Cited

U.S. PATENT DOCUMENTS 8,709,538 B1    4/2014  Cumberland
2006/0006478 A1  1/2006  Kanegae et al.
(Continued)

*Primary Examiner* — Whitney T Moore
(74) *Attorney, Agent, or Firm* — Jacqueline J. Garner; Charles A. Brill; Frank D. Cimino

(57) ABSTRACT

A microelectronic device includes semiconductor device with a component at a front surface of the semiconductor device and a backside heat spreader layer on a back surface of the semiconductor device. The backside heat spreader layer is 100 nanometers to 3 microns thick, has an in-plane thermal conductivity of at least 150 watts/meter-° K, and an electrical resistivity less than 100 micro-ohm-centimeters.

14 Claims, 8 Drawing Sheets

(51) Int. Cl.
 *H01L 21/48* (2006.01)
 *H01L 23/367* (2006.01)

(52) U.S. Cl.
 CPC .............. *H01L 2224/131* (2013.01); *H01L 2224/16225* (2013.01); *H01L 2224/291* (2013.01); *H01L 2224/2919* (2013.01); *H01L 2224/2929* (2013.01); *H01L 2224/29191* (2013.01); *H01L 2224/29339* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73204* (2013.01); *H01L 2224/73265* (2013.01); *H01L 2224/83447* (2013.01); *H01L 2224/94* (2013.01); *H01L 2924/00014* (2013.01); *H01L 2924/15311* (2013.01); *H01L 2924/181* (2013.01)

(56) References Cited

U.S. PATENT DOCUMENTS

| | | |
|---|---|---|
| 2009/0232991 A1 | 9/2009 | Wang et al. |
| 2012/0175755 A1 | 7/2012 | Bayerer |
| 2012/0280253 A1 | 11/2012 | Sung et al. |
| 2014/0284040 A1 | 9/2014 | Colgan et al. |
| 2015/0008588 A1 | 1/2015 | Kim et al. |
| 2015/0325495 A1 | 11/2015 | Sato et al. |

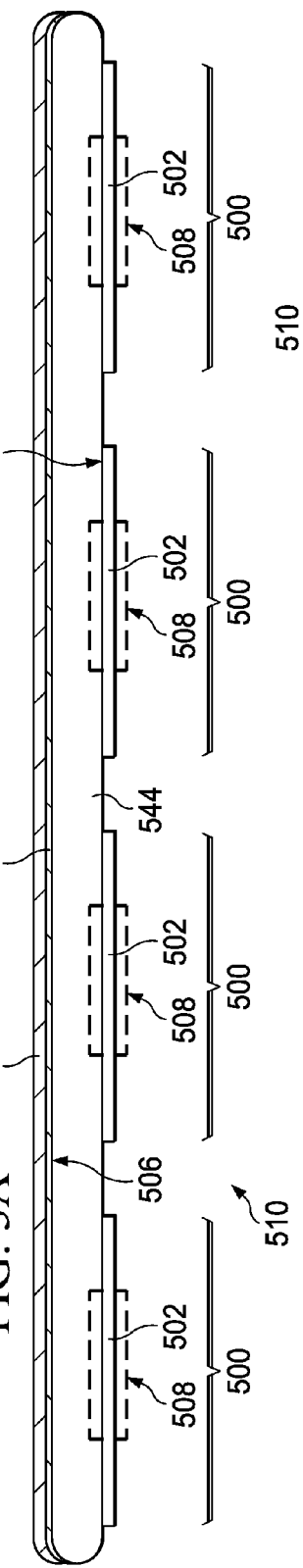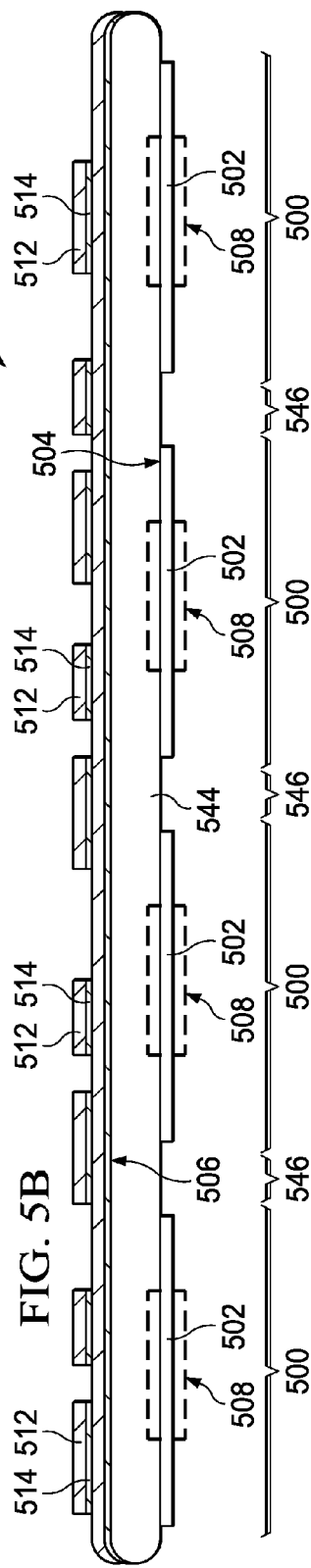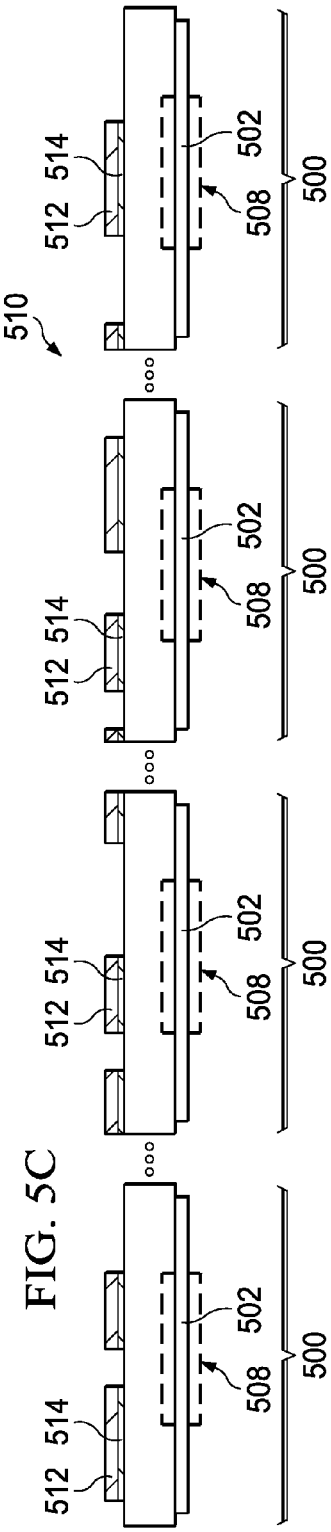

INTEGRATION OF BACKSIDE HEAT SPREADER FOR THERMAL MANAGEMENT

CROSS REFERENCE TO RELATED APPLICATIONS

This application is a continuation of U.S. Nonprovisional patent application Ser. No. 14/499,222, filed Sep. 28, 2014, the contents of which are herein incorporated by reference in its entirety.

FIELD OF THE INVENTION

This invention relates to the field of microelectronic devices. More particularly, this invention relates to thermal management structures in microelectronic devices.

BACKGROUND OF THE INVENTION

Semiconductor devices with localized heat generating components experience hot spots which cause reduced reliability. Removing the heat while maintaining desired costs and structural form factors has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device includes semiconductor device with a component at a front surface of the semiconductor device and a backside heat spreader layer on a back surface of the semiconductor device. The backside heat spreader layer is 100 nanometers to 3 microns thick, has an in-plane thermal conductivity of at least 150 watts/meter-° K, and an electrical resistivity less than 100 micro-ohm-centimeters.

DESCRIPTION OF THE VIEWS OF THE DRAWING

FIG. 5A through FIG. 5C depict an example process of forming microelectronic devices with backside heat spreader layers.

DETAILED DESCRIPTION OF EXAMPLE EMBODIMENTS

The following co-pending patent application is related and hereby incorporated by reference: U.S. patent application Ser. No. 14/499,216.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "microelectronic device" may refer to a semiconductor device, such as an integrated circuit or a discrete semiconductor component, may refer to a semiconductor device in a wafer with other semiconductor devices, may refer to a semiconductor device mounted on a substrate, may refer to a semiconductor device in a package, and may refer to a semiconductor device encapsulated in an electrically insulating material.

Figure 1:
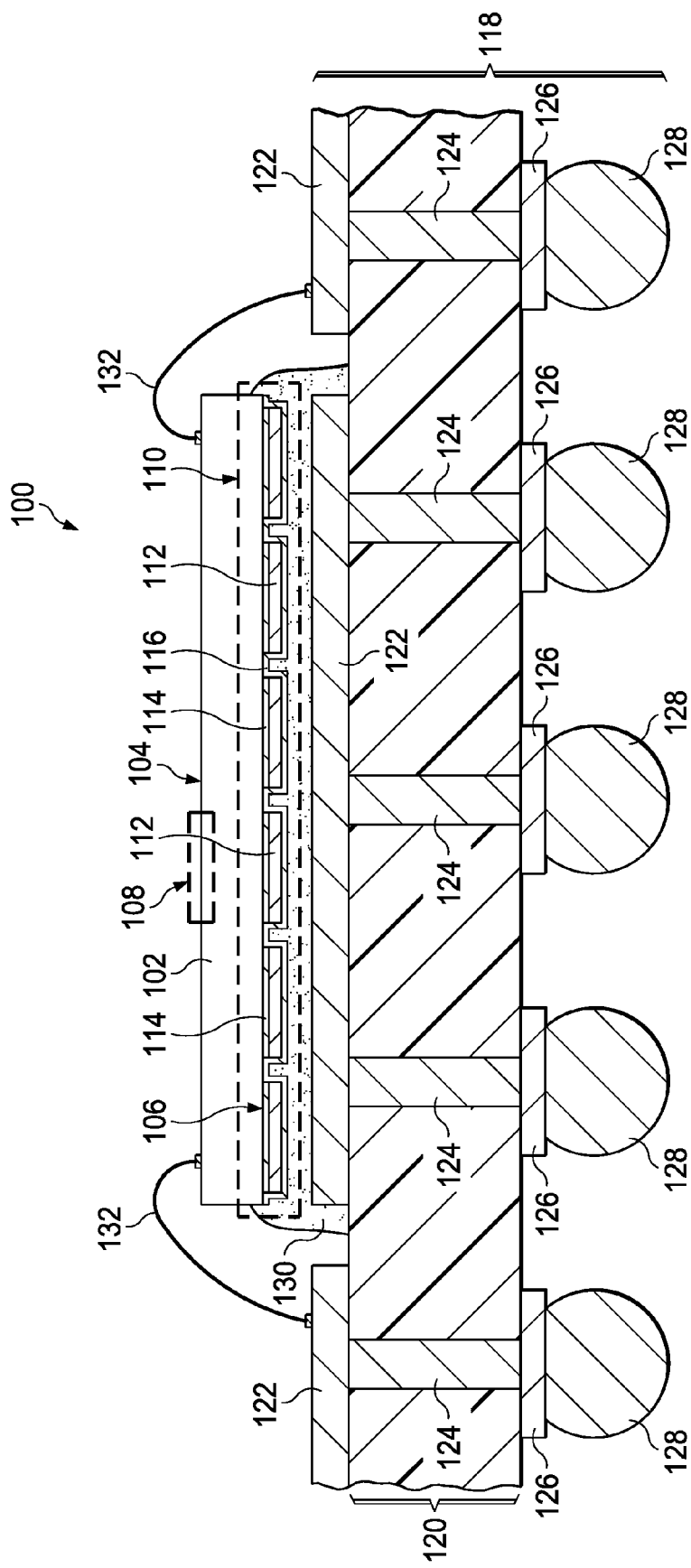
FIG. 1 is a cross section of an example microelectronic device with a backside heat spreader layer.

FIG. 1 is a cross section of an example microelectronic device with a backside heat spreader layer. The microelectronic device 100 includes a semiconductor device 102 having a front surface 104 and a back surface 106. A component 108, such as a transistor, a diode, or a resistor, is formed in the semiconductor device 102 at the front surface 104. The component 108 may extend deep into the semiconductor device, possibly to the back surface 106. A backside heat spreader layer 110 is formed at the back surface 106 of the semiconductor device 102. The backside heat spreader layer 110 includes a heat spreader material 112 which may be patterned as depicted in FIG. 1 or may be continuous. The heat spreader material 112 is 100 nanometers to 3 microns thick, has an in-plane thermal conductivity of at least 150 watts/meter-° K, and an electrical resistivity less than 100 micro-ohm-centimeters. The heat spreader material 112 may include, for example, graphite, carbon nanotubes (CNTs), multiple layers of graphene, and/or boron nitride. The backside heat spreader layer 110 may optionally include an adhesion layer 114 between the heat spreader material 112 and the back surface 106 of the semiconductor device 102. The adhesion layer 114 may include, for example, titanium or titanium tungsten formed by sputtering, and may reduce delamination of the heat spreader material 112. Other metals such as nickel may be added to the adhesion layer 114 to improve subsequent formation of the heat spreader material 112. The backside heat spreader layer 110 may optionally include a cap layer 116 on the heat spreader material 112 opposite from the back surface 106. The cap layer 116 may include, for example titanium and titanium nitride, formed by sputtering, and may reduce delamination of the heat spreader material 112.

The semiconductor device 102 is mounted on a substrate 118 which includes a header 120 containing fiber reinforced plastic (FRP), top leads 122 containing copper, vias 124 containing copper connected to the top leads 122, bottom leads 126 containing copper connected to the vias 124, and solder balls 128 connected to the bottom leads 126. The semiconductor device 102 is attached to the substrate 118 with an electrically insulating die attach adhesive 130 such as epoxy which attaches the backside heat spreader layer 110 to the top leads 122. Circuits in the semiconductor device 102 are connected to the top leads 122 by wire bonds 132 at the front surface 104. During operation of the microelectronic device 100, the component 108 may generate an undesired amount of heat; the backside heat spreader layer 110 may conduct the heat away from the component 108 and so advantageously reduce a temperature rise in the component 108 compared to a similar microelectronic device with no backside heat spreader layer.

Figure 2:
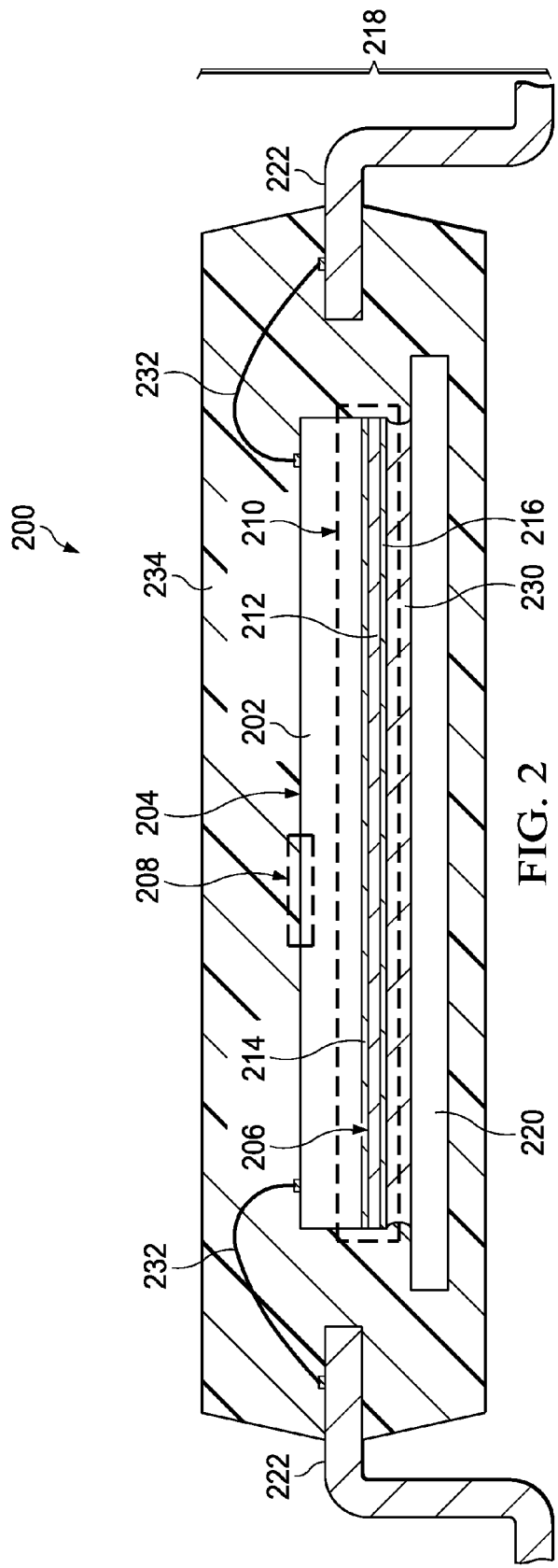
FIG. 2 is a cross section of another example microelectronic device with a backside heat spreader layer.

FIG. 2 is a cross section of another example microelectronic device with a backside heat spreader layer. The microelectronic device 200 includes a semiconductor device 202 having a front surface 204 and a back surface 206. A component 208 is formed in the semiconductor device 202 at the front surface 204. The component 208 may extend deep into the semiconductor device, possibly to the back surface 206. A backside heat spreader layer 210 is formed at the back surface 206 of the semiconductor device 202. The backside heat spreader layer 210 includes a heat spreader material 212 which may be continuous as depicted in FIG. 2 or may be patterned. The heat spreader material 212 is 100 nanometers to 3 microns thick, has an in-plane thermal conductivity of at least 150 watts/meter-° K, and an electrical resistivity less than 100 micro-ohm-centimeters. In the instant example, the heat spreader material 212 is electrically conductive and may include, for example, graphite, CNTs, and/or multiple layers of graphene. The backside heat spreader layer 210 may optionally include an adhesion layer 214 between the heat spreader material 212 and the back surface 206 of the semiconductor device 202, as described in reference to FIG. 1. The backside heat spreader layer 210 may optionally include a cap layer 216 on the heat spreader material 212 opposite from the back surface 206. The cap layer 216 may include layers of copper and nickel.

The semiconductor device 202 is mounted on a grounded plate 220 of a dual in-line package (DIP) 218. The semiconductor device 202 is attached to the grounded plate 220 with an electrically conducting die attach material 230 such as solder or silver-filled epoxy which attaches the backside heat spreader layer 210 to the grounded plate 220. The DIP 218 includes metal leads 222. Circuits in the semiconductor device 202 are connected to the leads 222 by wire bonds 232 at the front surface 204. The microelectronic device includes a plastic electrically insulating material 234 which encapsulates the semiconductor device 202 and the grounded plate 220 and holds the leads 222 in place. The microelectronic device 200 may accrue the same benefit from the backside heat spreader layer 210 as described in reference to FIG. 1.

Figure 3:
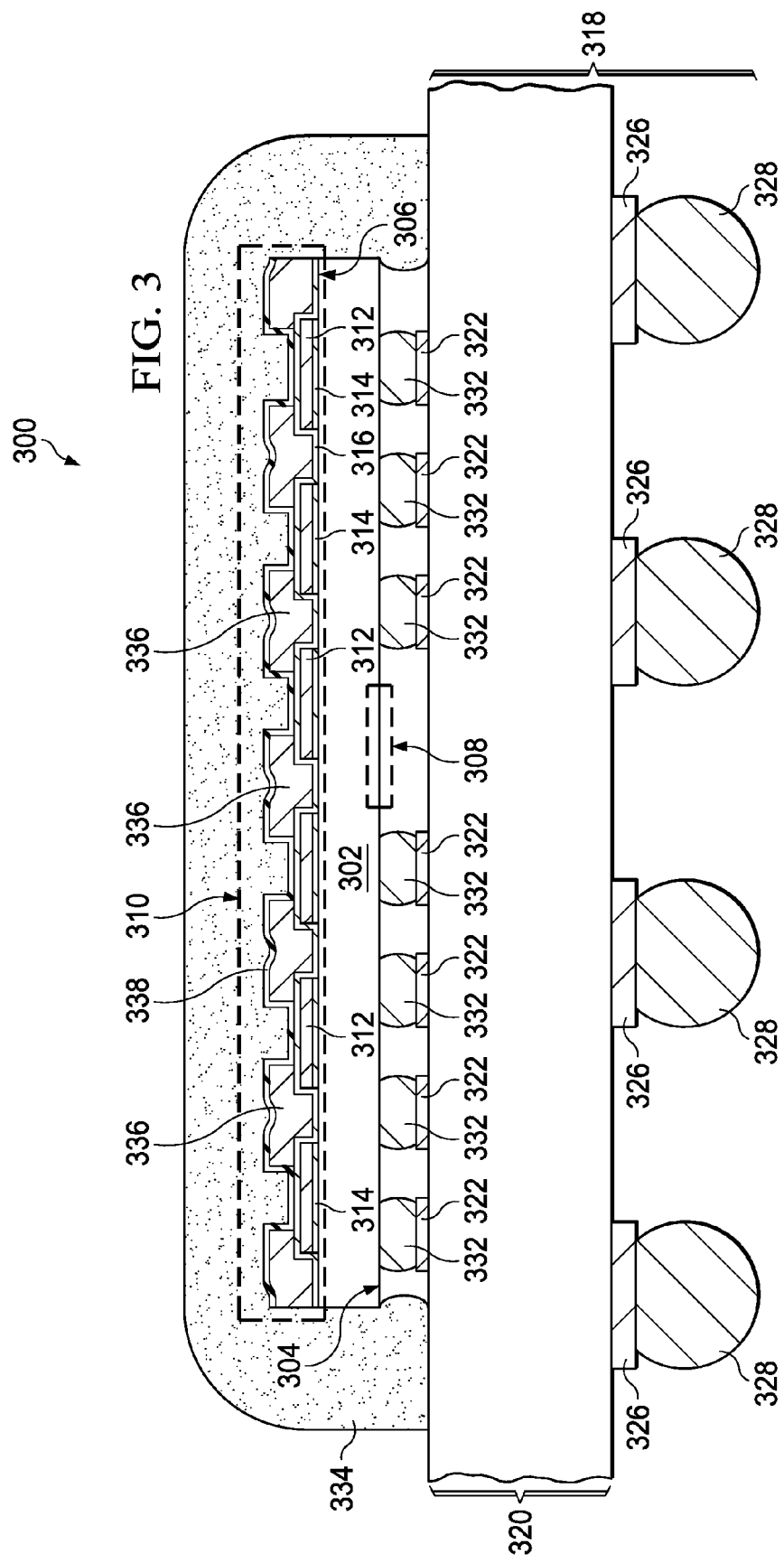
FIG. 3 is a cross section of another example microelectronic device with a backside heat spreader layer.

FIG. 3 is a cross section of another example microelectronic device with a backside heat spreader layer. The microelectronic device 300 includes a semiconductor device 302 having a front surface 304 and a back surface 306. A component 308 is formed in the semiconductor device 302 at the front surface 304. The component 308 may extend deep into the semiconductor device, possibly to the back surface 306.

A backside heat spreader layer 310 is formed at the back surface 306 of the semiconductor device 302. In the instant example, the backside heat spreader layer 310 includes a first heat spreader material 312 which is patterned as depicted in FIG. 2. The first heat spreader material 312 is 100 nanometers to 3 microns thick, has an in-plane thermal conductivity of at least 150 watts/meter-° K, and an electrical resistivity less than 100 micro-ohm-centimeters. The first heat spreader material 312 may include, for example, graphite, CNTs, multiple layers of graphene, and/or boron nitride. The backside heat spreader layer 310 may optionally include an adhesion layer 314 between the first heat spreader material 312 and the back surface 306 of the semiconductor device 302, as described in reference to FIG. 1. The backside heat spreader layer 310 may optionally include a first cap layer 316 on the first heat spreader material 312 opposite from the back surface 306. The first cap layer 316 may include titanium and titanium nitride. In the instant example, the backside heat spreader layer 310 includes a second heat spreader material 336 at the back surface 306 on the first heat spreader material 312, contacting the first cap layer 316 if present. The second heat spreader material 336 is also 100 nanometers to 3 microns thick, has an in-plane thermal conductivity of at least 150 watts/meter-° K, and an electrical resistivity less than 100 micro-ohm-centimeters. The second heat spreader material 336 may have a same composition as the first heat spreader material 312. The second heat spreader material 336 fills the gaps between the first heat spreader material 312, and may be patterned as depicted in FIG. 3 or may be continuous. The first cap layer 316 may provide adhesion for the second heat spreader material 336. The backside heat spreader layer 310 may optionally include a second cap layer 338 of titanium and titanium nitride.

Circuits in the semiconductor device 302 are bump bonded by solder bumps 332 at the front surface 304 to top leads 322 of a substrate 318. The substrate 318 includes a header 320 containing FRP; the top leads 322, bottom leads 326 connected to the top leads 322, and solder balls 328 connected to the bottom leads 326. An optional potting compound 334 may be applied to the semiconductor device 302, covering the backside heat spreader layer 310 and extending down to the substrate 318. During operation of the microelectronic device 300, the backside heat spreader layer 310 may advantageously conduct heat away from the component 308. Forming the backside heat spreader layer 310 with the second heat spreader material 336 overlapping and extending across gaps in the first heat spreader material 312 may advantageously reduce temperature rises in the component 308 compared to a segmented backside heat spreader layer having only one heat spreader material.

Figure 4:
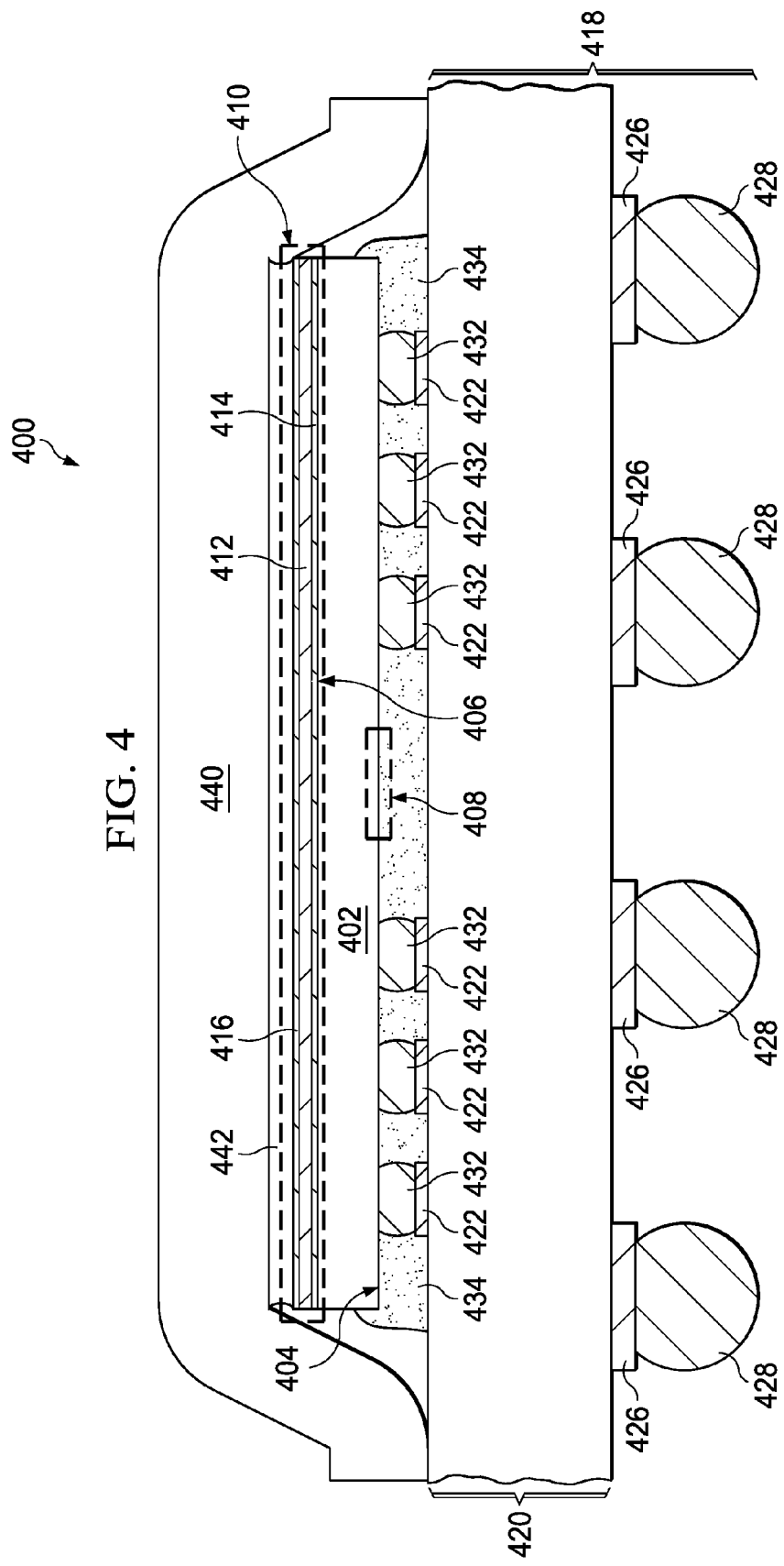
FIG. 4 is a cross section of another example microelectronic device with a backside heat spreader layer.

FIG. 4 is a cross section of another example microelectronic device with a backside heat spreader layer. The microelectronic device 400 includes a semiconductor device 402 having a front surface 404 and a back surface 406. A component 408 is formed in the semiconductor device 402 at the front surface 404. A backside heat spreader layer 410 is formed at the back surface 406 of the semiconductor device 402. In the instant example, the backside heat spreader layer 410 includes a continuous heat spreader material 412. The heat spreader material 412 is 100 nanometers to 3 microns thick, has an in-plane thermal conductivity of at least 150 watts/meter-° K, and an electrical resistivity less than 100 micro-ohm-centimeters. The heat spreader material 412 may include, for example, graphite, CNTs, multiple layers of graphene, and/or boron nitride. The backside heat spreader layer 410 may optionally include an adhesion layer 414 between the heat spreader material 412 and the back surface 406 of the semiconductor device 402, as described in reference to FIG. 1. The backside heat spreader layer 410 may optionally include a first cap layer 416 on the heat spreader material 412 opposite from the back surface 406. The first cap layer 416 may include titanium and titanium nitride.

Circuits in the semiconductor device 402 are bump bonded by solder bumps 432 at the front surface 404 to top leads 422 of a substrate 418. The substrate 418 includes a header 420 possibly containing FRP; the top leads 422 on the header 420, bottom leads 426 connected to the top leads 422, and solder balls 428 connected to the bottom leads 426.

An optional potting compound 434 may be applied to the semiconductor device 402, providing mechanical adhesion to the substrate 418.

In the instant example, a heatsink cap 440 is placed over the backside heat spreader layer 410, covering the semiconductor device 402 and possibly contacting the substrate 418 as depicted in FIG. 4. The heatsink cap 440 may be metal such as stainless steel. The heatsink cap 440 may be attached to the backside heat spreader layer 410 with a thermally conductive material 442 such as a filled epoxy or silicone-based heatsink compound.

During operation of the microelectronic device 400, the backside heat spreader layer 410 may advantageously conduct heat away from the component 408 and into the heatsink cap 440 and so reduce temperature rises in the component 408. The backside heat spreader layer 410 may advantageously improve heat transfer to the heatsink cap 440 compared to a microelectronic device with no backside heat spreader layer.

FIG. 5A through FIG. 5C depict an example process of forming microelectronic devices with backside heat spreader layers. Referring to FIG. 5A, a plurality of the microelectronic devices 500 are formed starting with a device substrate 544 comprising semiconductor material, such as a silicon wafer 544. The device substrate 544 is processed through fabrication steps to form a plurality of semiconductor devices 502 at a front surface 504 of the device substrate 544. Each microelectronic device 500 includes a semiconductor device 502, and each semiconductor device 502 includes a component 508 at the front surface, possibly extending into the device substrate 544, possibly to a back surface 506 of the device substrate 544. A continuous backside heat spreader layer 510 is formed at the back surface 506 of the device substrate 544. The backside heat spreader layer 510 includes a heat spreader material 512. The heat spreader material 512 is 100 nanometers to 3 microns thick, has an in-plane thermal conductivity of at least 150 watts/meter-° K, and an electrical resistivity less than 100 micro-ohm-centimeters. The heat spreader material 512 is may include, for example, graphite, CNTs, multiple layers of graphene, and/or boron nitride. The backside heat spreader layer 510 may optionally include an adhesion layer 514 between the heat spreader material 512 and the back surface 506 of the device substrate 544. Forming the backside heat spreader layer 510 across the back surface 506 of the plurality of the semiconductor devices 502 may advantageously reduce fabrication cost and complexity for the microelectronic devices 500.

Referring to FIG. 5B, the backside heat spreader layer 510 patterned, for example by a mask and etch process. A spatial configuration of the patterned backside heat spreader layer 510 may not necessarily coincide with or be aligned to a spatial configuration of the semiconductor devices 502. Scribe lines 546 between the semiconductor devices 502 may be designated for subsequently singulating the semiconductor devices 502, for example by sawing or scribing. In an alternate version of the instant example, the backside heat spreader layer 510 may not be patterned, remaining as a continuous layer until subsequent singulation. Patterning the backside heat spreader layer 510 before singulating the device substrate 544 may advantageously reduce fabrication cost and complexity for the microelectronic devices 500.

Referring to FIG. 5C, the microelectronic devices 500 are separated by singulating the device substrate 544 of FIG. 5B through the scribe lines 546. Each microelectronic device 500 may be further assembled, for example as described in reference to FIG. 1 through FIG. 4.

Figure 6:
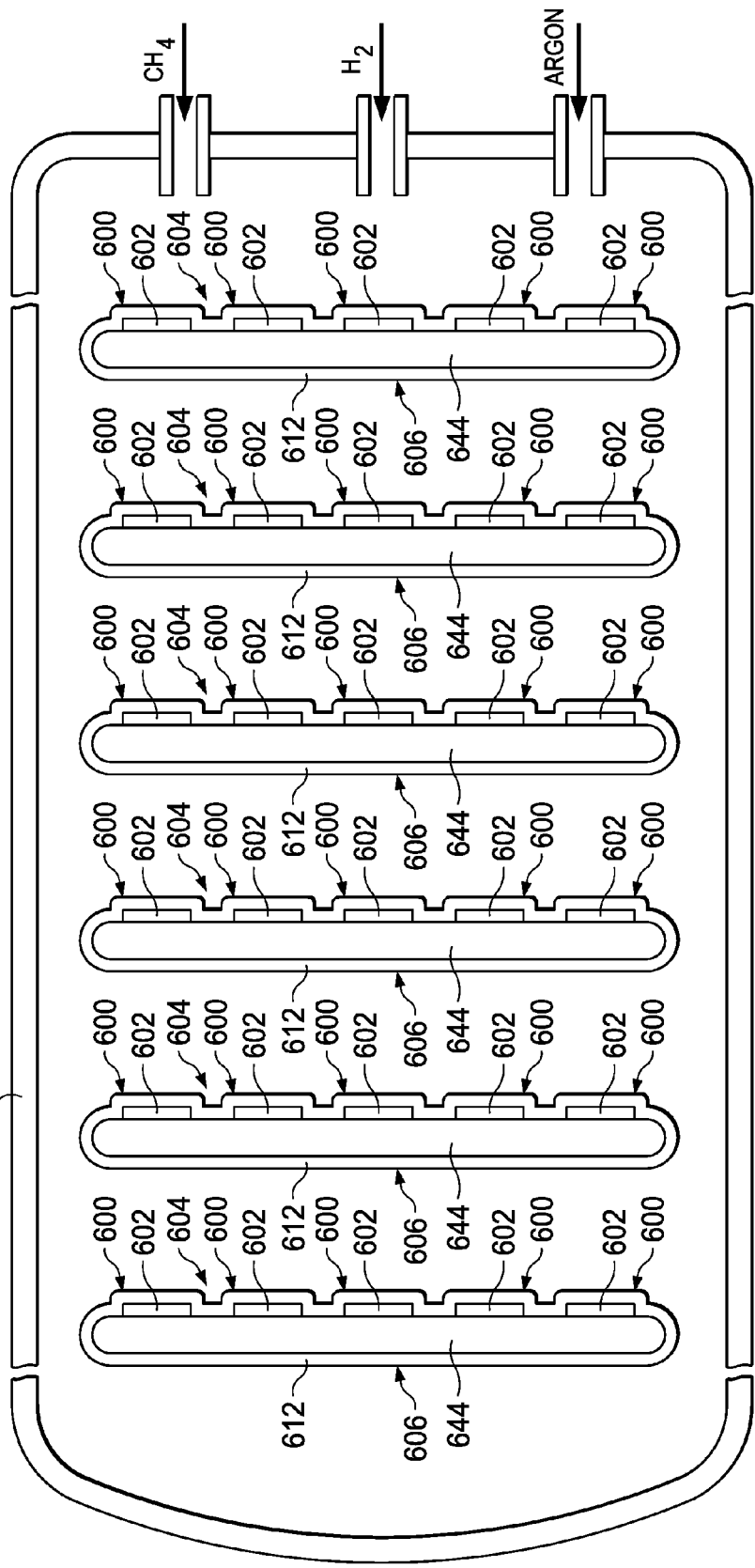
FIG. 6 depicts an example method for forming a backside heat spreader layer on a microelectronic device.

FIG. 6 depicts an example method for forming a backside heat spreader layer on a microelectronic device. A plurality of semiconductor devices 602 of the microelectronic devices 600 is formed on one or more device substrates 644. The device substrates 644 may be, for example, semiconductor wafers. Each semiconductor device 602 includes a component formed at a front surface 604 of the corresponding device substrate 644. Each device substrate 644 has a back surface 606 opposite from the front surface 604. The device substrates 644 are placed in a deposition chamber 648 such as a furnace tube, so that the front surface 604 and the back surface 606 of each device substrate 644 are exposed to an ambient of the deposition chamber 648. Reactant gases such as methane, hydrogen and argon are introduced into the deposition chamber 648 and the device substrates 644 are heated. RF power may possibly be applied to form a plasma in the reactant gases. The reactant gases form a layer of heat spreader material 612 concurrently on the front surface 604 and the back surface 606 of each device substrate 644. The device substrates 644 are subsequently removed from the deposition chamber 648. The layer of heat spreader material 612 may be patterned on the back surface 606 of each device substrate 644, for example as described in reference to FIG. 5A through FIG. 5C, to form backside heat spreader layers on the microelectronic devices 600. The layer of heat spreader material 612 may be patterned on the front surface 604 of each semiconductor device 602 to form heat spreader layers which may advantageously reduce rises in temperature of the component, as described in the commonly assigned patent application having patent application Ser. No. 14/499,216, filed concurrently with this application, which is incorporated herein by reference. Forming the layer of heat spreader material 612 concurrently on the front surface 604 and the back surface 606 may advantageously reduce fabrication cost and complexity of the microelectronic devices 600.

Figure 7A:
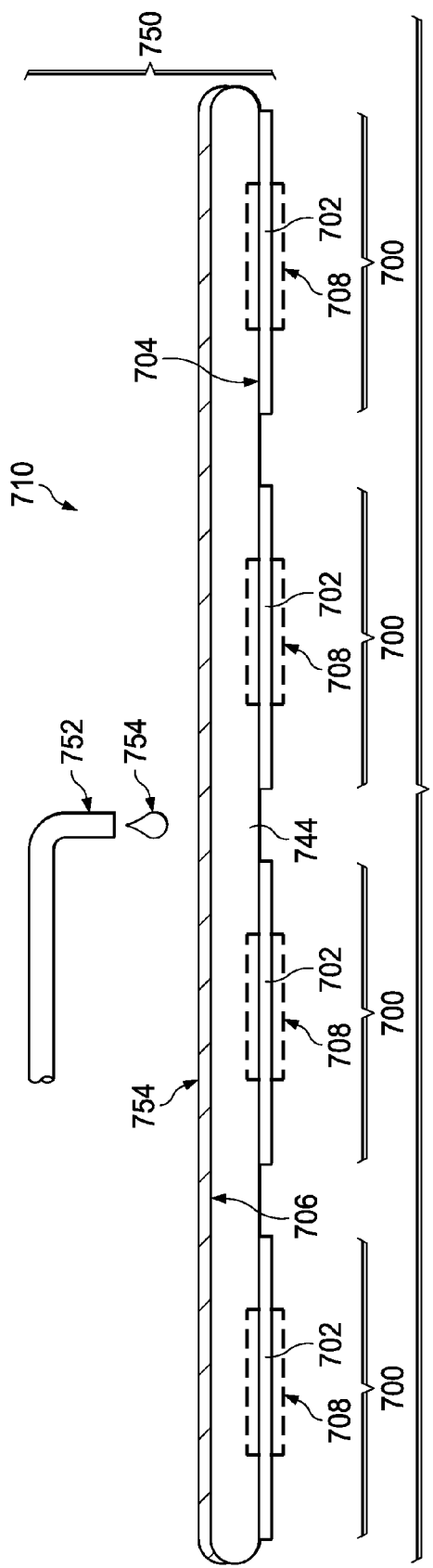
FIG. 7A and FIG. 7B depict another example method for forming a heat spreader layer on a microelectronic device.
Figure 7B:
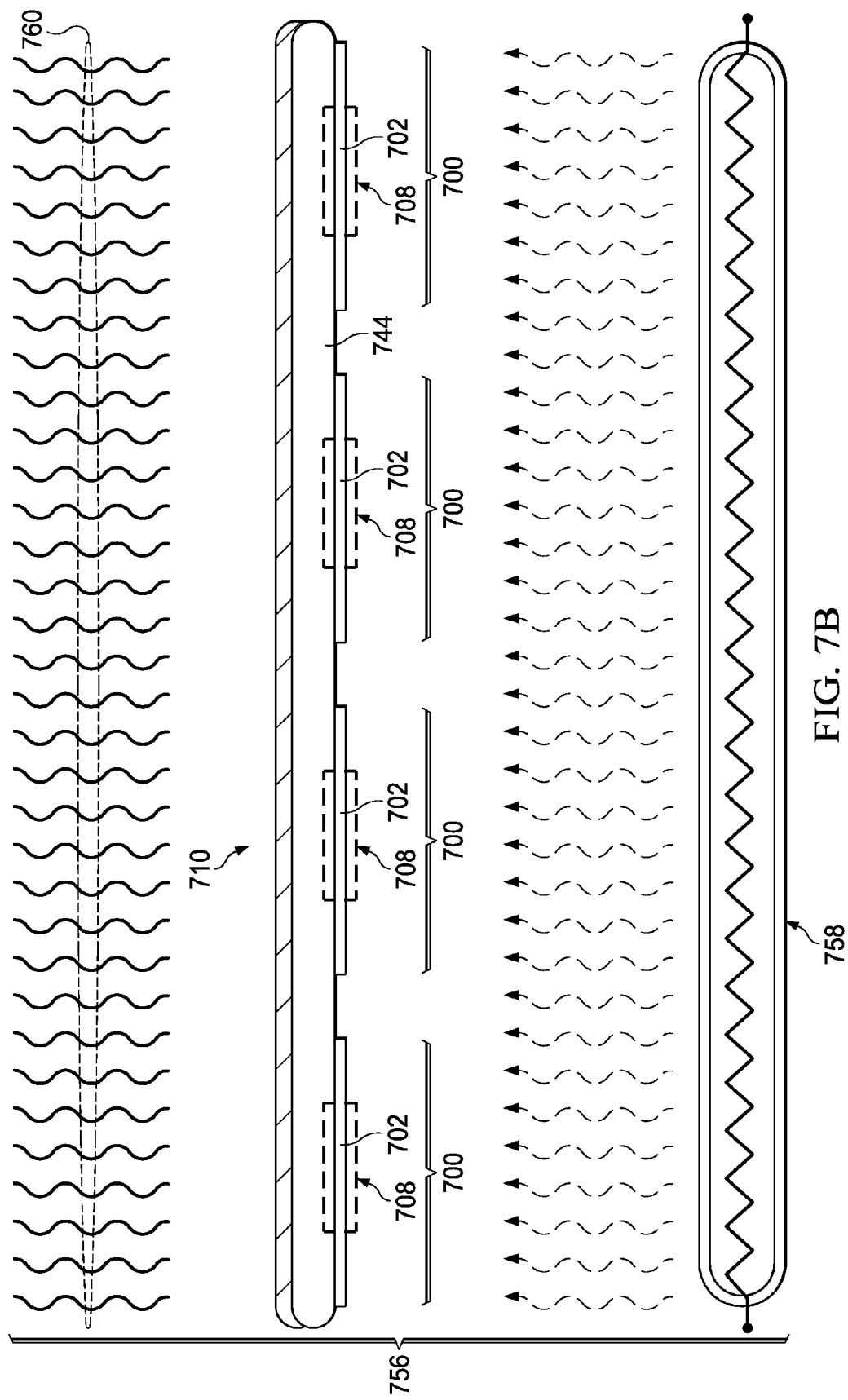

FIG. 7A and FIG. 7B depict another example method for forming a heat spreader layer on a microelectronic device. Referring to FIG. 7A, a plurality of semiconductor devices 702 of the microelectronic devices 700 is formed on a device substrate 744 which may be, for example, a semiconductor wafer. Each semiconductor device 702 includes a component 708 formed at a front surface 704 of the device substrate 744. Each device substrate 744 has a back surface 706 opposite from the front surface 704.

The device substrate 744 is placed in a spin-coating apparatus 750. A dispense apparatus 752 provides a CNT dispersion 754 onto the back surface 706 of the device substrate 744. The CNT dispersion 754 includes CNTs dispersed in a solvent.

Referring to FIG. 7B, the device substrate 744 is placed in a bake chamber 756 which heats the device substrate 744 to 100° C. to 150° C., for example using a radiant heater 758, so as to evaporate solvent 760 from the CNT dispersion 754 of FIG. 7A to provide the backside heat spreader layer 710. The backside heat spreader layer 710 thus includes CNTs overlapping each other in a continuous layer, which advantageously provides a high in-plane thermal conductivity. Forming the backside heat spreader layer 710 using the spin-coat process of FIG. 7A and FIG. 7B advantageously reduces a thermal profile of the microelectronic devices 700 and advantageously utilizes lower cost equipment compared to vacuum deposition equipment.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A microelectronic device, comprising:
   a semiconductor device having a front surface and a back surface;
   a component at the front surface;
   a backside heat spreader layer at the back surface, the backside heat spreader layer comprising a heat spreader material 100 nanometers to 3 microns thick, having an in-plane thermal conductivity of at least 150 watts/meter-° K and an electrical resistivity of less than 100 micro-ohm-centimeters; and
   a cap layer directly contacting and completely covering a surface of the backside heat spreader layer opposite the semiconductor device and sidewalls of the backside heat spreader layer.

2. The microelectronic device of claim 1, wherein the heat spreader material comprises graphite.

3. The microelectronic device of claim 1, wherein the heat spreader material comprises carbon nanotubes (CNTs).

4. The microelectronic device of claim 1, wherein the backside heat spreader layer is patterned.

5. The microelectronic device of claim 1, wherein the backside heat spreader layer comprises an adhesion layer between the heat spreader material and the back surface.

6. The microelectronic device of claim 1, wherein the cap layer comprises titanium and titanium nitride.

7. The microelectronic device of claim 1, wherein the microelectronic device further comprises a substrate, wherein the semiconductor device is attached to the substrate by a die attach material contacting the substrate and the backside heat spreader layer.

8. The microelectronic device of claim 1, wherein the microelectronic device further comprises a substrate, wherein the semiconductor device is attached to the substrate by bump bonds at the front surface, the bump bonds contacting the substrate, and the backside heat spreader layer is attached to a heat sink.

9. A microelectronic device, comprising:
   a semiconductor device having a first surface and a second surface opposite the first surface;
   a component at the first surface;
   a backside heat spreader layer at the second surface, the backside heat spreader layer comprising:
      a heat spreader material selected from the group consisting of graphite, carbon nanotubes, multiple layers of graphene, boron nitride, or a combination thereof;
      an adhesion layer comprising titanium between the heat spreader material and the second surface; and
      a cap layer comprising titanium directly contacting and completely covering a surface of the heat spreader material opposite the semiconductor device and sidewalls of the heat spreader material.

10. The microelectronic device of claim 9, wherein the adhesion layer comprises titanium tungsten.

11. The microelectronic device of claim 9, wherein the cap layer comprises titanium nitride.

12. The microelectronic device of claim 9, wherein the backside heat spreader layer consists of multiple islands of said heat spreader material, each separated from the second surface by said adhesion layer.

13. The microelectronic device of claim 9, wherein the microelectronic device further comprises a substrate, wherein the semiconductor device is attached to the substrate by a die attach material contacting the substrate and the backside heat spreader layer.

14. The microelectronic device of claim 9, wherein the microelectronic device further comprises a substrate, wherein the semiconductor device is attached to the substrate by bump bonds at the front surface, the bump bonds contacting the substrate, and the backside heat spreader layer is attached to a heat sink.

* * * * *